(12) United States Patent
Stacey et al.

(10) Patent No.: US 12,400,971 B2
(45) Date of Patent: Aug. 26, 2025

(54) CONTROLLING WARPAGE OF A SUBSTRATE FOR MOUNTING A SEMICONDUCTOR DIE

(71) Applicant: Graphcore Limited, Bristol (GB)

(72) Inventors: Simon Jonathan Stacey, Bristol (GB); Yang Chih Wang, Kaohsiung (TW)

(73) Assignee: GRAPHCORE LIMITED, Bristol (GB)

( * ) Notice: Subject to any disclaimer, the term of this patent is extended or adjusted under 35 U.S.C. 154(b) by 772 days.

(21) Appl. No.: 17/443,165

(22) Filed: Jul. 21, 2021

(65) Prior Publication Data

US 2022/0173054 A1 Jun. 2, 2022

(30) Foreign Application Priority Data

Nov. 27, 2020 (GB) .................................. 2018676

(51) Int. Cl.
| | | |
|---|---|---|
| *H01L 23/00* | (2006.01) | |
| *H01L 21/768* | (2006.01) | |
| *H01L 23/14* | (2006.01) | |
| *H01L 23/498* | (2006.01) | |
| *H01L 23/532* | (2006.01) | |
| *H05K 1/09* | (2006.01) | |
| *H05K 1/18* | (2006.01) | |

(52) U.S. Cl.
CPC .......... *H01L 23/562* (2013.01); *H01L 21/768* (2013.01); *H01L 23/14* (2013.01); *H01L 23/49816* (2013.01); *H01L 23/53228* (2013.01); *H01L 24/14* (2013.01); *H05K 1/09* (2013.01); *H05K 1/181* (2013.01)

(58) Field of Classification Search
CPC ................. H01L 23/14; H01L 21/4857; H01L 23/49822

See application file for complete search history.

(56) References Cited

U.S. PATENT DOCUMENTS

| | | | |
|---|---|---|---|
| 6,180,215 B1 | | 1/2001 | Sprietsma et al. |
| 6,248,959 B1 | * | 6/2001 | Sylvester .............. H01L 23/145 |
| | | | 257/E23.19 |

(Continued)

FOREIGN PATENT DOCUMENTS

| | | |
|---|---|---|
| EP | 0285714 A1 | 10/1988 |
| JP | 2011198878 A | 10/2011 |

OTHER PUBLICATIONS

International Search Report and Written Opinion dated Oct. 11, 2021 for Application No. PCT/EP2020/087567.

(Continued)

*Primary Examiner* — Evren Seven
(74) *Attorney, Agent, or Firm* — HAYNES AND BOONE, LLPC

(57) ABSTRACT

A substrate and a method for manufacturing the substrate. The substrate is suitable for mounting at least one semiconductor die onto a printed circuit board. The substrate comprises two opposing stacks, with each stack comprising alternating layers of copper and electrically insulating film. The film and the copper have different co-efficients of thermal expansion, allowing the warpage behaviour of the substrate to be controlled by providing the substrate with different film thicknesses between the opposing stacks.

13 Claims, 8 Drawing Sheets

(56) References Cited

U.S. PATENT DOCUMENTS

| | | | |
|---|---|---|---|
| 7,605,460 B1* | 10/2009 | Wu | H05K 1/0265 257/691 |
| 2003/0080409 A1 | 5/2003 | Nakamura et al. | |
| 2004/0014317 A1* | 1/2004 | Sakamoto | H01L 23/49838 438/689 |
| 2005/0161823 A1* | 7/2005 | Jobetto | H01L 24/05 257/E23.178 |
| 2009/0026604 A1* | 1/2009 | Shin | H05K 1/183 257/E23.005 |
| 2009/0135574 A1* | 5/2009 | Tanaka | H01L 23/49822 156/60 |
| 2009/0273073 A1* | 11/2009 | Tachibana | H01L 23/293 528/421 |
| 2010/0244280 A1* | 9/2010 | Shimizu | H05K 3/28 438/665 |
| 2011/0000706 A1 | 1/2011 | Shomura | |
| 2011/0024172 A1* | 2/2011 | Maruyama | H01L 23/49822 174/250 |
| 2012/0024582 A1* | 2/2012 | Maeda | H01L 21/4857 174/258 |
| 2013/0027895 A1* | 1/2013 | Hayashi | H01L 25/105 174/265 |
| 2013/0062108 A1 | 3/2013 | Kondo | |
| 2013/0120952 A1* | 5/2013 | Kim | H05K 3/4688 174/250 |
| 2013/0147043 A1 | 6/2013 | Gonzalez | |
| 2016/0020164 A1* | 1/2016 | Terui | H01L 21/486 174/251 |
| 2016/0135293 A1 | 5/2016 | Lin et al. | |
| 2018/0047661 A1 | 2/2018 | Oshima | |
| 2020/0163223 A1* | 5/2020 | Mok | H01L 23/13 |
| 2020/0343212 A1 | 10/2020 | Huang | |

OTHER PUBLICATIONS

Examination Report dated Jul. 16, 2024 for Japanese Patent Application No. 2023-532374.

Examination Report dated Sep. 9, 2024 for Korean Patent Application No. 10-2023-7021561.

Office Action dated Jan. 6, 2025 for Japanese Application No. 2023-532374.

* cited by examiner

CONTROLLING WARPAGE OF A SUBSTRATE FOR MOUNTING A SEMICONDUCTOR DIE

CROSS-REFERENCE TO RELATED APPLICATIONS

The present application claims priority to United Kingdom Patent Application No. 2018676.3, filed on Nov. 27, 2020, the disclosure of which is hereby incorporated herein by reference in its entirety.

TECHNICAL FIELD

The present disclosure relates to a substrate for mounting a semiconductor die onto a printed circuit board and to a method of manufacturing such a substrate.

BACKGROUND

An integrated circuit is a set of electronic circuits that are manufactured on a single piece of semiconductor material (e.g. silicon). Typically, integrated circuits are produced in large batches on a single large wafer of the semiconductor material, which is then cut into pieces, with each piece containing a copy of the integrated circuit. Each of these pieces is referred to as a die.

In order to provide the integrated circuit in the form of a useful electronic component that may connect to other components to receive power and exchange signals, the die is mounted on a printed circuit board (PCB). Different techniques are known for mounting the die onto the PCB, each with their own advantages and disadvantages.

Some of the techniques for mounting the die onto the PCB make use of a substrate for bridging the interconnect pitch between die technology and PCB technology. The substrate comprises a plurality of layers of copper, which provide for electrical connectivity between the die and the PCB. These layers of copper are interleaved with layers of electrically insulating material. The copper provides electrical connections between the two sides of the substrate through vias in the electrically insulating material.

Since the layers of copper will generally vary in their arrangement throughout the substrate, the situation can occur in which there exists a copper imbalance between one side of the substrate and the other side of the substrate. This copper imbalance leads to an imbalance in the coefficient of thermal expansion (CTE) between one side of the substrate and the other side of the substrate. Since heat is applied during the process for manufacturing the substrate and mounting the die, the imbalance in the CTE between the two sides of the substrate leads to warpage in the substrate.

Warpage in the substrate presents certain problems during the package assembly process. For example, in flip chip packages the die is connected to the substrate using a plurality of solder bumps at a fine pitch and size. These solder bumps between the die and the substrate may become compromised. This may occur if the substrate warpage causes regions of the substrate to become too close to the die during the mounting process, leading to some of the soldered connections between the substrate and the die becoming compressed and potentially fused together as the waists of the solder bumps enlarge under the compression. Furthermore, warpage in the substrate may also lead to a failure to form some of the intended connections between the substrate and the PCB, as some of the package solder balls are held too far from the PCB to form a reliable solder joint.

SUMMARY

There is, therefore, a need to control the warpage of a substrate that occurs due to heating. One approach to solving this problem is to adjust the arrangement of copper layers so as to minimise the warpage that results from an imbalance in the amount of copper on different sides of the substrate. However, complete reliance on this approach imposes design constraints on the copper layout in the substrate, which can make achieving the required connectivity with appropriate power and signal integrity between the die and the PCB more challenging.

According to a first aspect, there is provided a substrate for mounting at least one semiconductor die onto a printed circuit board, the substrate comprising: on a first side of the substrate suitable for being arranged towards the semiconductor die, a first stack comprising a plurality of copper layers interleaved with layers of electrically insulating film; and on a second side of the substrate suitable for being arranged towards the printed circuit board, a second stack comprising a plurality of copper layers interleaved with layers of the electrically insulating film, wherein the electrically insulating film has a different co-efficient of thermal expansion to copper, wherein each of one or more of the layers of the electrically insulating film of the second stack has a different thickness to a corresponding one of the layers of the electrically insulating film of the first stack.

For this new substrate, the thickness of one or more of the layers of electrically insulating film is set to be greater on one side of the substrate vs the other side of the substrate. By doing so, the warpage behaviour may be controlled. By using differences in the thickness of the electrically insulating film to control the warpage of the substrate, it is possible to produce a substrate that exhibits more predictable warpage behaviour. This allows for the issues associated with warpage to be managed with less significant constraints on the design of the substrate.

This effect exhibited by the new substrate was of great surprise to the inventors. It was believed that, although an insulating film may have a different co-efficient of thermal expansion to copper, changes to the thickness of the insulating film would have little effect on the warpage of the substrate since the Young's Modulus of the materials used for such insulating films are typically considerably lower than the Young's Modulus of copper. However, experimental evidence has confirmed that producing substrates with even small differences in thickness between the layers of electrically insulating film produces significant effects on the warpage of the substrate.

In some embodiments, each of one or more of the layers of electrically insulating film of the second stack has a thickness that is greater than its corresponding one of the layers of the electrically insulating film of the first stack, wherein the electrically insulating film has a greater co-efficient of thermal expansion than copper.

In some embodiments, each of one or more of the layers of electrically insulating film of the second stack has a thickness that is greater than its corresponding one of the layers of the electrically insulating film of the first stack, wherein the electrically insulating film has a lower co-efficient of thermal expansion than copper.

In some embodiments, each of one or more of the layers of electrically insulating film of the second stack has a thickness that is less than its corresponding one of the layers of the electrically insulating film of the first stack, wherein the electrically insulating film has a greater co-efficient of thermal expansion than copper.

In some embodiments, each of one or more of the layers of electrically insulating film of the second stack has a thickness that is less than its corresponding one of the layers of the electrically insulating film of the first stack, wherein the electrically insulating film has a lower co-efficient of thermal expansion than copper.

In some embodiments, each of the one or more of the layers of the electrically insulating film of the second stack differs in thickness from its corresponding one of the layers of the electrically insulating film of the first stack by more than one micrometre.

In some embodiments, a part of each of the one or more of the layers of the electrically insulating film of the first stack has a first thickness, wherein the part of each of the one or more of the layers of the electrically insulating film of the first stack is between and adjacent to two of the copper layers of the first stack, wherein a part of each of the corresponding layers of the electrically insulating film of the second stack has a second thickness, wherein the part of each of the corresponding layers of the electrically insulating film of the second stack is between and adjacent to two of the copper layers of the second stack, wherein the first thickness is different to the second thickness.

In some embodiments, the first thickness is greater than the second thickness, wherein the electrically insulating film has a greater co-efficient of thermal expansion than copper.

In some embodiments, the first thickness differs from the second thickness by more than one micrometre.

In some embodiments, the one or more of the layers of the electrically insulating film of the second stack comprises one of the layers of electrically insulating film of the second stack that is configured to be arranged furthest from the printed circuit board, wherein the corresponding ones of the layers of the electrically insulating film of the first stack comprises one of the layers of electrically insulating film of the first stack that is configured to be arranged furthest from the semiconductor die.

In some embodiments, the one or more of the layers of the electrically insulating film of the second stack comprises only a single layer of electrically insulating film, wherein the corresponding one or more of the layers of the electrically insulating film of the first stack comprises only a single layer of electrically insulating film.

In some embodiments, the one or more of the layers of the electrically insulating film of the second stack comprises a plurality of layers of the electrically insulating film, wherein the corresponding one or more of the layers of the electrically insulating film of the first stack comprises a plurality of layers of the electrically insulating film.

In some embodiments, the electrically insulating film is build-up film.

In some embodiments, the substrate further comprises a core, wherein the first stack is arranged on a first side of the core, wherein the second stack is arranged on a second side of the core.

According to a second aspect, there is provided a method of manufacturing a substrate according to the first aspect, the method comprising: adding to the second stack, each of the one or more of the layers of the electrically insulating film of the second stack, such that is overlays one of the layers of copper of the second stack, adding to the first stack, each of the corresponding one or more of the layers of the electrically insulating film of the first stack, such that is overlays one of the layers of copper of the first stack, wherein each of the one or more of the layers of the electrically insulating film of the second stack has a thickness, when added to the second stack, that is different to a thickness of its corresponding one of the layers of the electrically insulating film of the first stack when that corresponding one of the layers is added to the first stack, the method comprising: applying heat to cause each of the one or more of the layers of the electrically insulating film of the second stack and each of the corresponding one or more of the layers of the electrically insulating film of the first stack to become thinner at least at a region of the respective layer overlaying one of the layers of copper, wherein, following the heating process, each of the one or more of the layers of the electrically insulating film of the second stack has a thickness that is different to a thickness of its corresponding one of the layers of the electrically insulating film of the first stack.

In some embodiments, following the heating process, each of the one or more of the layers of the electrically insulating film of the second stack has a thickness at its region overlaying one of the layers of copper that is different to a thickness of its corresponding one of the layers of the electrically insulating film of the first stack at that corresponding layer's region overlaying one of the layers of copper.

In some embodiments, for each of the one or more of the layers of the electrically insulating film of the second stack, its thickness when added to the second stack, is different by at least one micrometre from the thickness of its corresponding one of the layers of the electrically insulating film of the first stack when that corresponding one of the layers is added to the first stack.

In some embodiments, following the heating process, each of the one or more of the layers of the electrically insulating film of the second stack has a thickness that is different to a thickness of its corresponding one of the layers of the electrically insulating film of the first stack by at least one micrometre.

In some embodiments, each of the one or more of the layers of the electrically insulating film of the second stack has a thickness, when added to the second stack, that is greater than a thickness of its corresponding one of the layers of the electrically insulating film of the first stack when that corresponding one of the layers is added to the first stack, wherein, following the heating process, each of the one or more of the layers of the electrically insulating film of the second stack has a thickness that is greater than a thickness of its corresponding one of the layers of the electrically insulating film of the first stack.

In some embodiments, each of the one or more of the layers of the electrically insulating film of the second stack has a thickness, when added to the second stack, that is less than a thickness of its corresponding one of the layers of the electrically insulating film of the first stack when that corresponding one of the layers is added to the first stack, wherein, following the heating process, each of the one or more of the layers of the electrically insulating film of the second stack has a thickness that is less than a thickness of its corresponding one of the layers of the electrically insulating film of the first stack.

According to a third aspect, there is provided a substrate manufactured using the method according to the second aspect.

According to a fourth aspect, there is provided a device comprising: a substrate according to the first aspect; a semiconductor die mounted on the substrate; a printed circuit board; and a plurality of solder balls forming connections between an outer copper layer of the second stack and connection pads of either the printed circuit board or a further substrate for mounting on the printed circuit board.

In some embodiments, the device comprises a further plurality of solder bumps forming connections between an outer copper layer of the first stack and connection pads of the semiconductor die.

In some embodiments, the device is a flip chip package.

BRIEF DESCRIPTION OF DRAWINGS

For a better understanding of the present invention, and to show how the same may be carried into effect, reference will now be made by way of example to the accompanying Figures in which.

DETAILED DESCRIPTION

Embodiments will now be described in more detail with reference to the accompanying Figures. These embodiments may be implemented with an integrated circuit comprising an intelligence processing unit (IPU), which is described in U.S. application Ser. No. 15/886,065, which is incorporated by reference. Each die discussed in the following examples may comprise such an IPU.

There are different techniques that may be used to mount a die to a PCB. A first of such techniques, which is referred to as flip chip, makes use of a series of solder bumps to form connections between the die and the substrate. In this technique, the die is 'flipped', i.e. positioned such that the semiconductor wafer faces away from the substrate, and the active side of the die comprising the connection pads faces the substrate. The solder bumps are formed on these connection pads on the active side, so as to connect the pads to the substrate.

Figure 1:
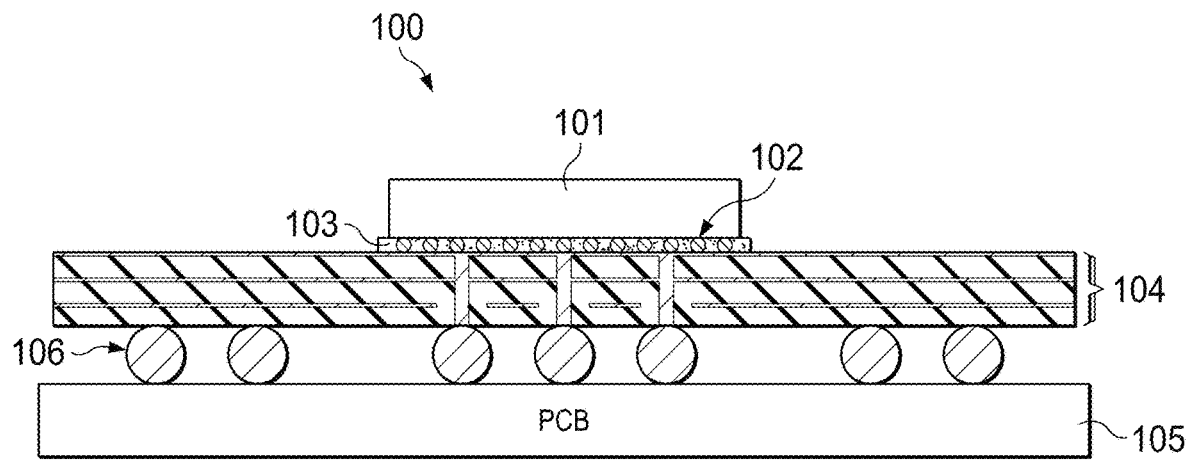
FIG. 1 illustrates an example of a flip chip package.

Reference is made to FIG. 1, which illustrates an example of a flip chip package 100. The package 100 shows the die 101 with a series of solder bumps 102 arranged along one side of the die 101. During a reflow process, the package 100 is heated (e.g. to 240 C.°) so as to melt the solder bumps 102 to form connections between the die 101 and the substrate 104. Following the reflow process, the solder bumps 102 cool and solidify and fix the die 101 to the substrate 104. In a subsequent process, an adhesive 103, referred to as the underfill 103, is added on top of the substrate 104 and flows between the gaps between the solder bumps 102. This underfill 103 is then heated to cure it and form a supportive bond between the die 101 and the substrate 104 via a network of underfill 103, which is left between the solder bumps 102. This reduces stress on the active circuitry of the die 101 due to coefficient of thermal expansion differences, and further prevents any fusing between the solder bumps 102 that could occur during any subsequent reflow of the package 100. The solder bumps 102 are fixed at predetermined connection points on the substrate 104 allowing for electrical connectivity between the connection pads of the die 101 and the substrate 104 via the solder bumps 102. The predetermined connection points are part of a top layer of copper of the substrate 104.

On the other side of the substrate 104, the substrate 104 is connected to the PCB 105 by a series of solder balls 106. These solder balls 106 are larger in size that the bumps 102 and may be referred to as ball grid array (BGA) solder balls 106. During the reflow process in which the package 100 is heated (e.g. to 240 C°), the solder balls 106 are melted. Following this process, the solder balls 106 cool, fixing the substrate 104 to the PCB 105. The solder balls 106 are fixed to predetermined connection points on the bottom of the substrate 104, so as to provide electrical connectivity between the substrate 104 and connection points on the PCB 105. These predetermined connection points are part of a bottom layer of copper of the substrate 104.

A second technique for mounting a die to a PCB is referred to as wirebond, and makes use of a series of wire pads that are fixed to the active side of the die, which is positioned away from the substrate. These wirebond pads are connected to wires, the other ends of which form connections with predetermined connection points on the substrate.

Figure 2:
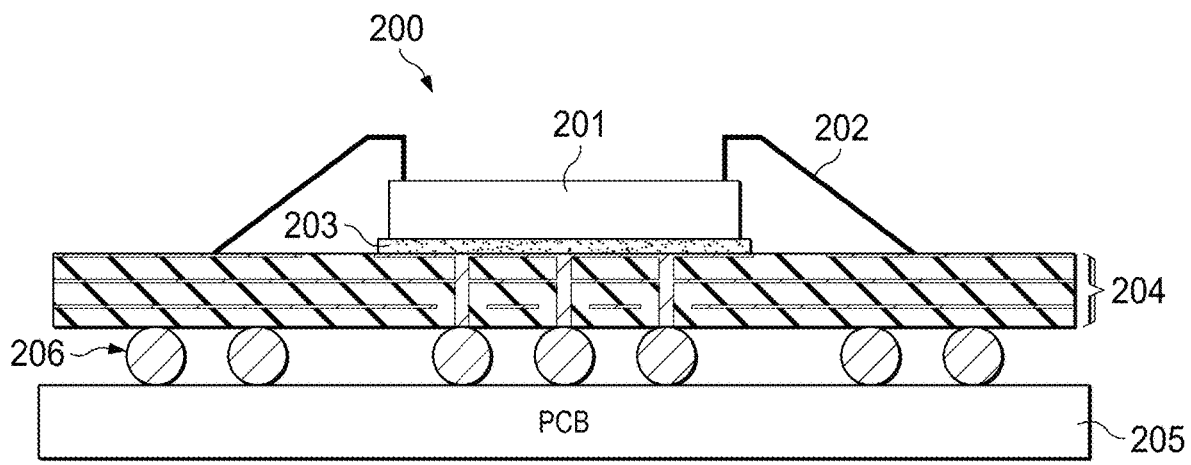
FIG. 2 illustrates an example of a wirebond package.

Reference is made to FIG. 2, which illustrates an example of a wirebond package 200. The die 201 shown may be functionally the same as die 101, but in this case, the active side of the die 201 faces away from the substrate 204. The connection pads on top of the die 201 are connected via wires 202 to the substrate 204. The wires 202 connect to predetermined connection points on the top layer of copper on the substrate 204, so as to form appropriate connections through the substrate 204 to the PCB 205.

The die 201 is fixed to the substrate 204 using a die attach adhesive 203 without the use of the solder bumps 102.

As in the example of the flip chip package 100, the substrate 204 is connected to the PCB 205 via the solder balls 206, which may be BGA balls. As with the solder balls 106 shown in FIG. 1, these solder balls 206 are heated and positioned at connection points on the bottom copper layer of the substrate 204. The solder balls 206 form electrical connections between the substrate 204 and connection points on the PCB 205. Once cooled, the connections between the substrate 204 and the PCB 205 via balls 206 are made permanent.

Although FIGS. 1 and 2 both show a substrate 104, 204 that is directly connected to the PCB 205 via solder balls 106, 206, in some embodiments of the disclosure, the substrate to which the die is connected may be connected to one or more further substrates that are positioned between the substrate and the PCB. In this case, solder balls (such as balls 106, 206) fix the substrate to a further substrate, so as to mount the die to the PCB via the one or more further substrates.

Embodiments of the disclosure have advantages for both a flip chip package 100 and a wirebond package 200. By controlling the warpage of a substrate, the probability of faults at the solder bump/ball connections used to connect the substrate to the die/PCB may be reduced. Since both the flip chip package 100 and the wirebond package 200 use solder balls 106, 206 to connect the substrate 104, 204 to the PCB 105, 205 (either directly or via one or more further substrates), embodiments are applicable to both the flip chip package 100 and the wirebond package 200. However, since the flip chip package 100 also comprises the additional set of solder bumps 102 that are used to connect the die 101 to the substrate 104, some embodiments are particularly advantageous when applied to flip chip packages 100.

Figure 3:
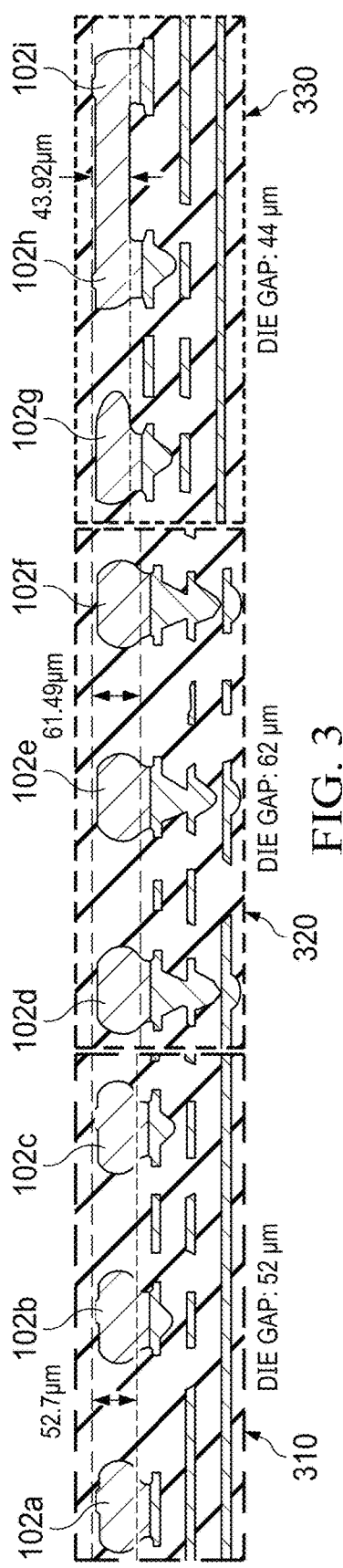
FIG. 3 is a cross-sectional view of the top of a substrate in a flip chip package.

Reference is made to FIG. 3, which illustrates an example of a plurality of cross-sectional views along the top of the substrate 104 used in the flip chip package 100. The cross-sectional views show the effects of warpage on the solder bumps 102a-i used at different points along the bottom of the die 101. A first cross-sectional view 310 is a view of the solder bumps 102a-c positioned at one edge of the die 101. A second cross-sectional view 320 is a view of the solder bumps 102d-f positioned approximately in the middle of the die 101. A third cross-sectional view 330 is a view of the solder bumps 102g-i positioned at the other edge of the die 101.

The three different views 310, 320, 330 are taken for a substrate 104 that is warped in such a way that the substrate 104 is closer to the die 101 at the edges of the die 101, than at the centre of the die 101. Such a substrate is said to exhibit positive warpage. The effects of this positive warpage may be observed by comparing the cross-sectional views 310, 320, 330. The distance between the die 101 and the substrate 104 in central view 320 is 62 µm, whereas the distances between the die 101 and the substrate 104 in the edge views 310, 330 are 52 µm and 44 µm, respectively.

As may be seen from the views 310, 330, when the gap between die 101 and the substrate 104 is smaller, the solders bumps 102 may become squashed and deformed. Solder bumps 102a-c and solder bump 102g all display a level of deformation resulting from the closeness between the substrate 104 and the die 101 at their respective positions on the substrate 104. This is not necessarily problematic for operation of the device if the deformation is kept below a certain level. However, if the deformation becomes too great during the reflow process, deformed solder bumps may connect, resulting in a single fused solder bump and without two separate connections between the die 101 and the substrate 104. This is seen in FIG. 3, where the solder bump 102h has merged with solder bump 102i to form a single extended solder bump.

It would be appreciated that as well as presenting connectivity issues at the interface between the die 101 and the substrate 104, the warpage of the substrate 104 may also present connectivity issues at the interface between the substrate 104 and the PCB 105. For example, the warpage of the substrate 104 causing the gap between the die 101 and the substrate 104 at the edges of the substrate 104 to be narrow as shown in FIG. 3, may lead to the gap between the PCB 105 the substrate 104 at the edges of the substrate 104 becoming larger. This larger gap may mean that the solder balls 106 located at the edge of the substrate 104 don't make contact with the PCB 105 and therefore don't form the reliable solder joints that are intended. This problem at the substrate/PCB interface may also be present in the wirebond package 200 shown in FIG. 2, as well as in the flip chip package shown in FIG. 1. The problem may also be present at the interface between the substrate 104, 204 and a further substrate, if such a further substrate is used to mount the substrate 104, 204 and die 101, 201 to the PCB 105, 205.

Figure 4:
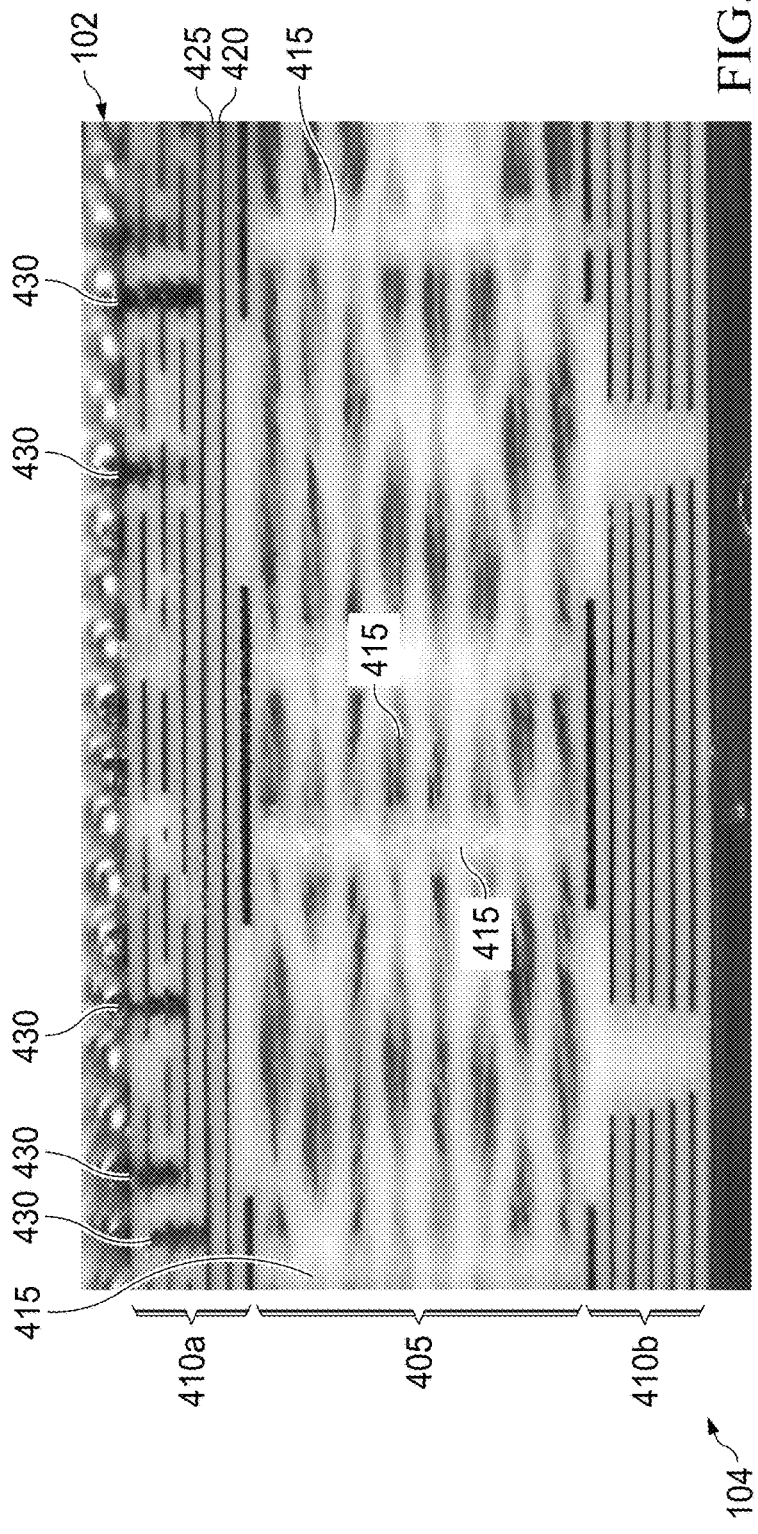
FIG. 4 is a cross-sectional view of a substrate.

Reference is made to FIG. 4, which shows a cross-section of substrate 104. On top of the substrate 104 are shown the solder bumps 102. The substrate 104 comprises a core 405 around which are built two stacks 410a, 410b. Each of the stacks 410a, 410b comprises a plurality of copper layers interleaved with a plurality of layers of electrically insulating film. For example, FIG. 4 shows an example layer of copper 420 and an example layer of electrically insulating film 425 that are part of stack 410a. The term "first stack" is used in this description to refer to the stack that is suitable for attachment to the die. Stack 410a is, therefore, an example of a first stack. The term "second stack" is used in this description to refer to the stack that is suitable for attachment to the PCB or to a further substrate for mounting to the PCB. Stack 410b is therefore an example of a second stack.

The core 405 comprises a mixture of glass and resin material on which the layers of the stacks 410a, 410b are built. A plurality of holes are drilled through the core 405 and copper plating is added to these holes to form vias 415. The vias 415 provide connectivity between the two stacks 410a, 410b, enabling connections to be formed through the substrate 104.

In some cases, the layers of copper and electrically insulating film may be deposited on the core 405 one after another. In this case, the electrically insulating film may be referred to as build up film. The build-up film may, for example, be Ajinimoto Build up film (ABF). When constructing each of the stacks 410a, 410b, a layer of copper is initially deposited on the core 405. This copper is patterned to provide the required connectivity for that layer, e.g. to provide for connectivity between one or more of the vias 415 and the copper of the next copper layer above in the respective stack 410a, 410b. After forming and patterning the first layer of copper, the first layer of the build-up film is added to the exposed surface. The film is compressed and heated so that it flows into the gaps between the copper, leaving a planar surface. Holes are created in the film to expose the first copper layer at the base of the hole or via and a second layer of copper is added on top of the film. The second layer of copper enters the vias to provide connectivity between the first layer of copper and the second layer of copper. Example vias 430 between copper layers are shown in FIG. 4. Further layers of build-up film and further layers of copper are added to both the sides of the partially constructed substrate to provide the stacks 410a, 410b. The arrangement of copper in the stack 410a provides connections between the one or more of the solder bumps 102 and one or more of the vias 415 in the core 405. Likewise, the arrangement of copper in the stack 410b provides connections between the one or more of the solder balls 106 (not shown in FIG. 4) and the one or more of the vias 415 in the core 405.

Although it has been described that each layer of the stacks 410a, 410b are built up in turn, in other examples, rather than depositing separate individual layers of build-up film and copper, a layer of electrically insulating film can be provided with a layer of copper attached. Each such layer is referred to as a pre-preg, with the pre-preg layers being deposited one on top of the other to produce each of the stacks 410a, 410b.

Although FIG. 4 shows the substrate 104 used in the flip chip package 100, the substrate 204 used in the wirebond package 200 may possess the same features described herein as being possessed by the substrate 104, but with the absence of the solder bumps 102 on the top of the substrate 104.

Furthermore, although it has been described that each of the stacks 410a, 410b is provided on one side of a core 405, a substrate may be provided as a coreless substrate, with each of the stacks 410a, 410b being directly connected to one another.

As may be seen in FIG. 4, the arrangement of the copper layers in stack 410a is noticeably different to the arrangement of the copper layers in stack 410b. The differences in arrangement of the layouts can lead to copper imbalance between the two stacks 410a, 410b, which can cause the substrate 104 to warp as it is heated.

Figure 5:
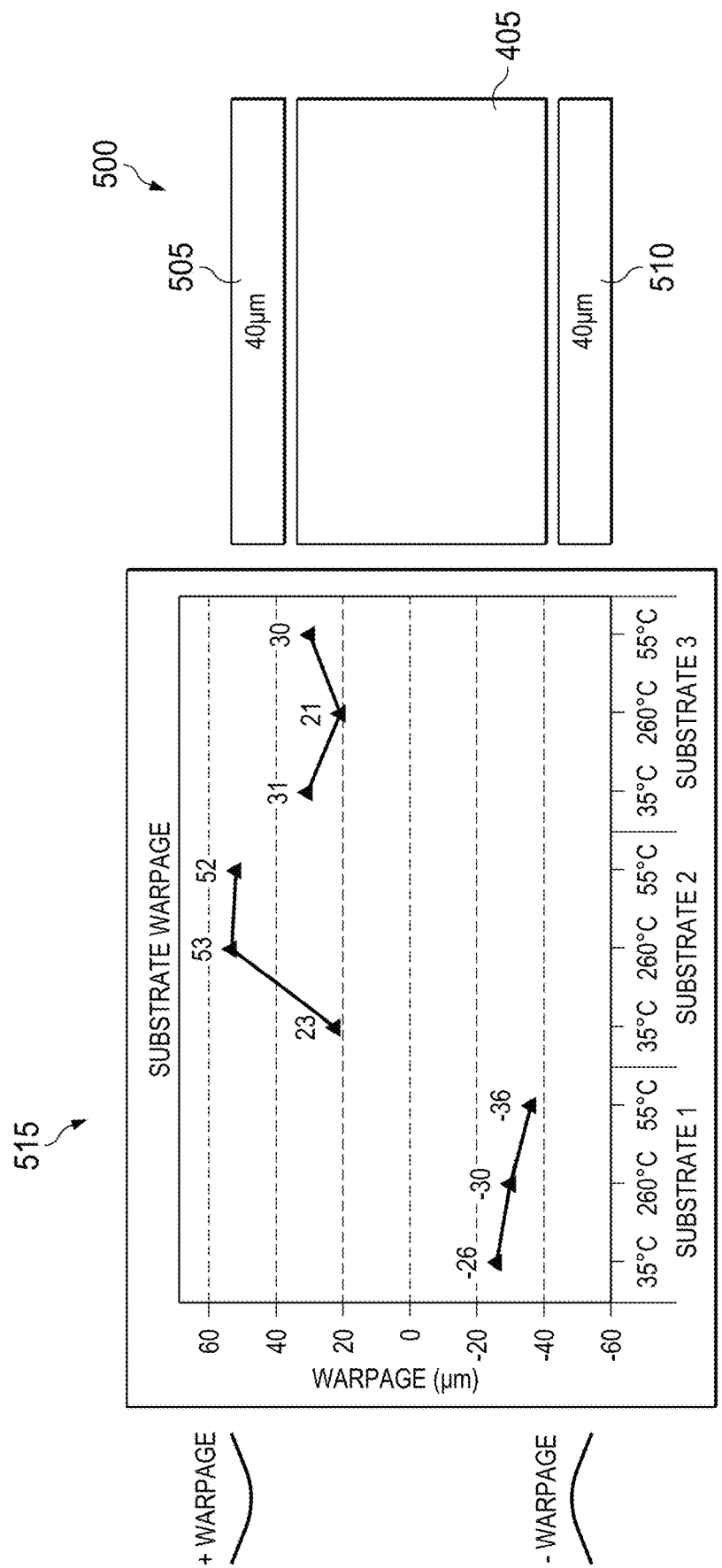
FIG. 5 illustrates part of a substrate, and its associated warpage behaviour, where the substrate has layers of electrically insulating film of the same thickness in both stacks.

Reference is made to FIG. 5, which illustrates how the warpage of either of these substrates 104, 204 may vary with temperature for different samples in the case that the layers of electrically insulating film on both sides of the substrate have the same thickness. FIG. 5 shows part 500 of a substrate. The part 500 of the substrate includes a core 405 and two layers 505, 510 of electrically insulating film on either side of the core 405. The layers 505, 510 are at corresponding positions in their respective stacks. Each of the layers 505, 510 may be the layer of electrically insulating film that is furthest from the edge of the substrate (e.g closest to the core 405) in its respective stack.

The layers 505, 510 are added to the stacks with the same thickness as one another, which in this example is 40 μm. As will be described, the thickness of each layer may change when heat is applied to soften the layers to allow them to deform. The remaining layers of the stacks (not shown in FIG. 5) are each provided with the same thickness as their corresponding layer in the opposing stack.

The graph 515 shows how the warpage behaviour varies with temperature for three different substrate samples. Warpage may be positive or negative. A positive warpage indicates that the substrate curves upwards towards the die at the edges of the die. A negative warpage indicates the opposite, i.e. that the substrate curves away from the die at the edges of the die. Positive warpage is associated with the problems discussed above with respect to FIG. 3 and is generally more undesirable.

The first sample (substrate 1) shown in the graph 515 exhibits negative warpage (−26) when at 35 C°, and also exhibits negative warpage (−30) when heated to 260 C°. When the sample substrate is cooled to 55 C°, the substrate still exhibits the negative warpage (−36).

The second sample shown in the graph 515 exhibits positive warpage (23) when at 35 C°, and exhibits an even greater positive warpage (53) when heated to 260 C°. When the sample substrate is cooled to 55 C°, the substrate retains high positive warpage (52).

The third sample shown in the graph 515 shows positive warpage (31) when at 35 C°, and positive warpage (21) when at 260 C°. When the sample substrate is cooled to 55 C°, the substrate still exhibits positive warpage (30).

It is therefore understood that, when the two films 505, 510 are of equal thickness, the warpage behaviour is not consistent between different substrate samples. The warpage may be positive or negative and is highly dependent upon the particular arrangement of copper layers on either side of the substrate. Furthermore, the direction of the warpage may vary as a result of natural variations in the manufacturing process.

The effect of temperature changes may also be seen in FIG. 5. As noted, the copper imbalance between the two sides of the substrate leads to warpage when the substrate is heated. Since heat is applied during the manufacturing process, the finished substrate exhibits warpage. As shown in FIG. 5, the substrate warpage may also change in response to the application of further heat (e.g. during the reflow process used to mount the die to the substrate).

According to embodiments of the disclosure, a new substrate is provided. In this new substrate, at least one layer of electrically insulating film in one of the copper, film stacks is thicker than a corresponding layer in the other of the copper, film stacks. In some embodiments, only one pair of corresponding layers in the stacks differs in thickness. In other embodiments, multiple pairs of corresponding layers in the stacks may differ in thickness. Since the electrically insulating film is provided with a different co-efficient of thermal expansion to copper, by controlling the thickness of layers of the electrically insulating film on either side of the substrate in this way, the warpage of the substrate is controlled.

By "corresponding layers" it is here meant layers that occupy the same position in their respective stacks. For example, the first layer of electrically insulating film in a first stack (i.e. the layer of the first stack that is furthest from the die and, in the case that a core is present, closest to the core of the substrate) may be said to correspond to the first layer of electrically insulating film in the second stack (i.e. the layer of the second stack that is furthest from the PCB and, in the case that a core is present, closest to the core of the substrate).

The new substrate according to embodiments of the disclosure may possess the same features as the substrates 104, 204 discussed above, but with one or more corresponding layers in the stacks 410a, 410b having different thicknesses. Although each of the example substrates 104, 204 is presented as having a core 405, in some embodiments of the new substrate, the core 405 may not be present, but the two stacks may be directly connected together.

Reference will now be made to FIGS. 6 to 9, with reference to which example embodiments of the disclosure are described. In these examples, the CTE of the electrically insulating film is greater than that of copper, resulting in the behaviour shown and described. In the description, the thickness of the layers of electrically insulating film is discussed. Herein, discussion of the "thickness" refers to the average thickness of the relevant layer of film across the substrate.

Figure 6:
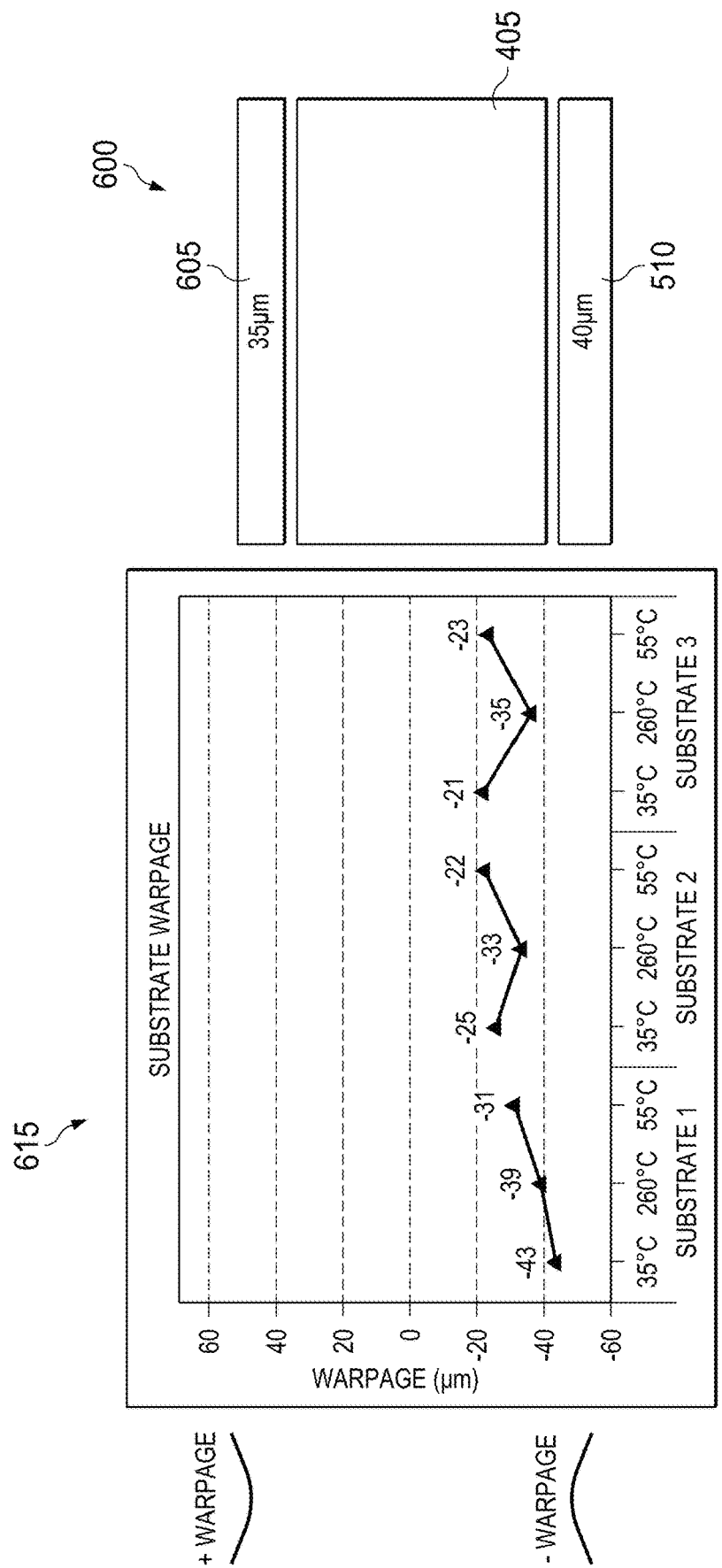
FIG. 6 illustrates part of a substrate, and its associated warpage behaviour, where the substrate has a layer of electrically insulating film in the top stack of the substrate that is thinner than a corresponding layer in the bottom stack of the substrate.

Reference is made to FIG. 6, which illustrates how the warpage of the substrate may vary with temperature for different samples of a substrate according embodiments of the invention. FIG. 6 illustrates a part 600 of a substrate showing two layers 605, 510 of electrically insulating film surrounding the core 405. The two layers 605, 510 are at corresponding positions in their respective stacks. In some embodiments, the layers 605, 510 may be the layers of electrically insulating film in their respective stack that are furthest from the substrate (e.g. closest to the core 405).

The example part 600 of the substrate may be the same as part 500 of the substrate with, however, the difference being that the layer 510 in the bottom of the half of the substrate is thicker than the layer 605 in the top half of the substrate. In this example, the film layer 510 is 5 micrometres thicker than the film layer 605.

The thickness values shown in FIG. 6 indicate the thicknesses for the films added to the stacks at manufacturing time. The layer 605 added as part of the first stack is 35 μm thick when added to the first stack. The layer 510 added as part of the second stack is 40 µm thick when added to the second stack. When both of these layers are added, the part 600 of the substrate is heated and pressed which will cause the films to become thinner at the points at which they overlay the copper layer. However, following this heating and thinning process, the layer 605 will still be thinner than the layer 510.

As may be understood from the graph 615, the different substrate samples exhibit consistent negative warpage as temperature is varied. For each of the three samples, the warpage is negative when the samples are at 35 C°, are heated to 260 C°, or are cooled to 55 C°.

A substrate comprising the part 600 may be particularly suited to addressing the issues discussed above with respect to FIG. 3, in which the small solder bumps 102 towards the edges of the die fuse together. By exhibiting negative warpage consistently, the substrate is less likely to cause the solder bump 102 at the edges of the die to fuse together.

The part 600, therefore, allows the direction of the warpage of the substrate to be set to be consistently negative and reduces the variation in warpage between different samples resulting from small differences in copper balance or from natural variations in the manufacturing process. The other design factors, such as the copper balance and aspects of the assembly process, may then be adjusted in order to minimise the magnitude of the warpage that is exhibited by the substrate so as to produce a substrate that exhibits only a minimal amount of warpage. By reducing the amount of warpage to a low level, the resulting substrate not only will address the bridging problem discussed above with respect to FIG. 3, but will also address additional connectivity issues, such as between the substrate and the PCB.

Figure 7:
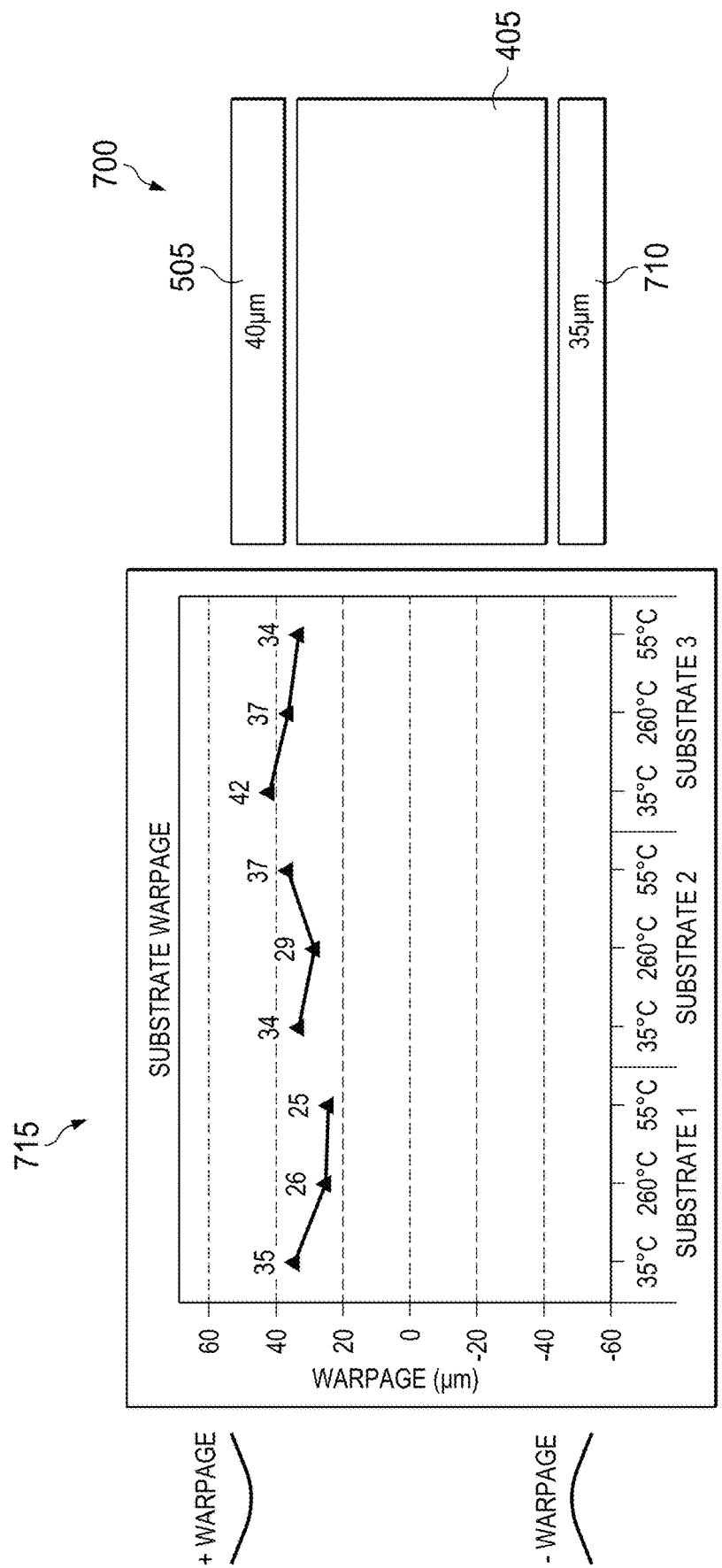
FIG. 7 illustrates part of a substrate, and its associated warpage behaviour, where the substrate has a layer of electrically insulating film in the top stack of the substrate that is thicker than a corresponding layer in the bottom stack of the substrate.

Reference is made to FIG. 7, which illustrates a further example of a part 700 of a substrate according to embodiments of the invention. The Figure shows how the warpage may vary with temperature for different samples of substrates including said part 700. FIG. 7 illustrates a part 700 of a substrate showing two layers 505, 710 of electrically insulating film surrounding the core 405. The two layers 505, 710 are at corresponding positions in their respective stacks. Each of the layers 505, 710 may be the layer of electrically insulating film that is furthest from the substrate (e.g. closest to the core 405) in its respective stack.

The example part 700 may be the same as parts 500, 600, with however the difference being that the layer 505 in the top half of the substrate is thicker than the layer 710 in the bottom half of the substrate. In this example, the film layer 505 is 5 micrometres thicker than the film layer 710.

As in FIG. 6, the thickness values shown in FIG. 7 indicate the thicknesses for the films added to the stacks at manufacturing time, which will be reduced in response to the heating and pressing process. However, following the heating and thinning process, the layer 505 will still be thicker than the layer 710.

The graph 715 shows the warpage for different substrate samples, each comprising the part 700. As may be understood from the graph 715, the substrate samples exhibit consistent positive warpage even as temperature is varied. For each of the three samples, the warpage is positive when the samples are at 35 C°, are heated to 260 C°, or are cooled to 55 C°.

The part 700, therefore, allows the direction of the warpage to be set to be consistently positive and causes the variation in the warpage between the samples to be reduced. By adjusting other design factors, such as copper balance, the magnitude of this warpage may be minimised. However, since perfect copper balance is not required to control the warpage, greater design freedom is provided.

In each of the example samples shown in FIGS. 6 and 7, all but one of the layers of film are provided with the same thickness (e.g. 40 µm). One of the electrically insulating film layers (layer 605 in FIG. 7 and layer 710 in FIG. 7) is however provided with a different thickness (e.g. 35 µm). It is, therefore, possible to modify the warpage behaviour of the substrate by modifying the thickness of only a single layer of electrically insulating film in the substrate. Although, in the examples shown in FIGS. 6 and 7, this different layer is provided with a reduced thickness with respect to other layers of the substrate, in other embodiments, the different layer may be provided with a greater thickness resulting in the opposite warpage behaviour to that indicated in the graphs 615, 715.

Figure 8:
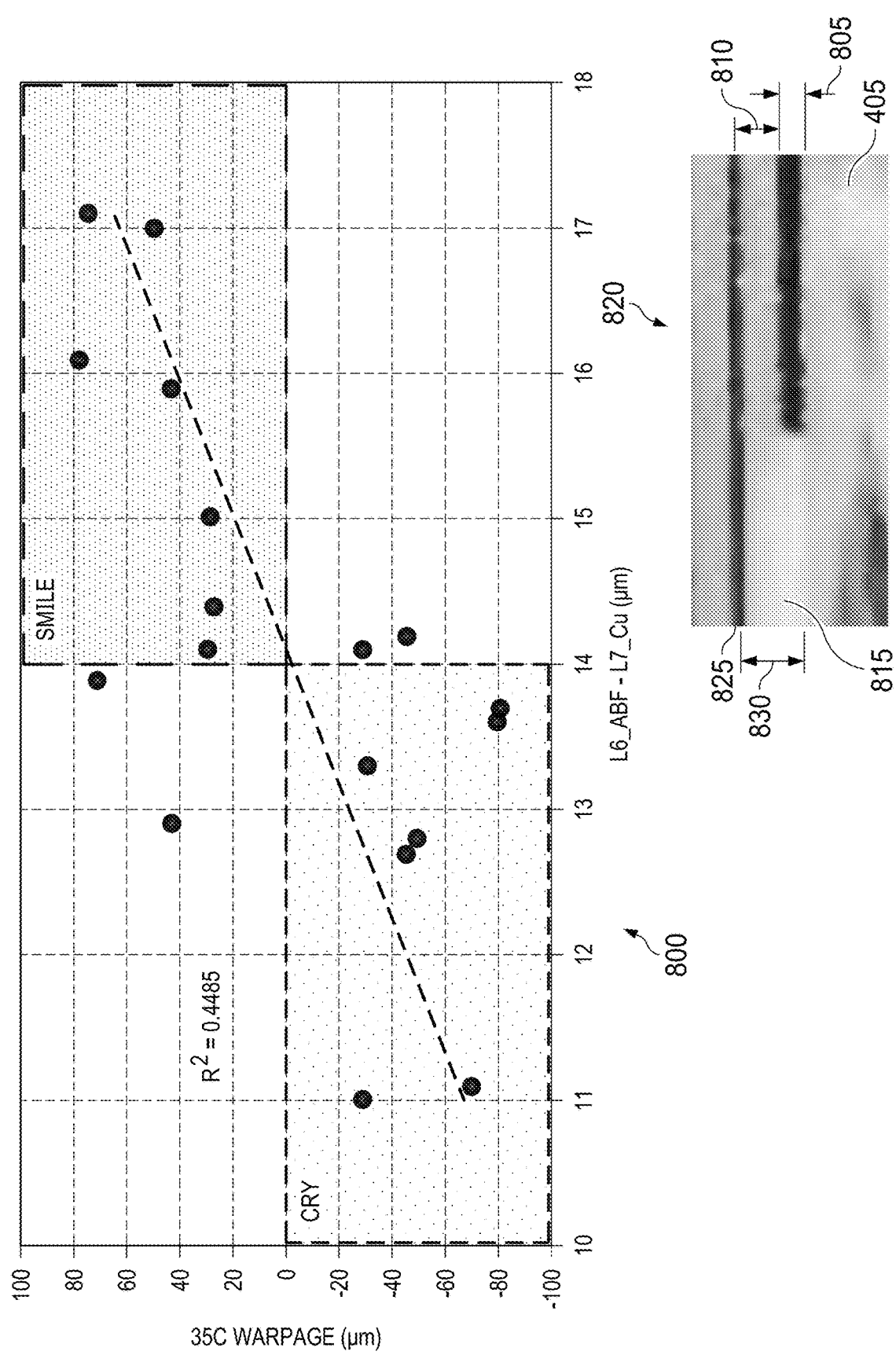
FIG. 8 shows the relationship between the thickness of a part of an electrically insulating film and the warpage of the substrate.

Reference is made to FIG. 8, which illustrates how the warpage for different substrate samples varies in dependence upon the thickness of a single layer of electrically insulating film in those samples. Specifically, the graph 800 shows how the warpage varies in dependence upon the thickness of a layer of film that is part of the first stack of the substrate. This is represented on the bottom axis of the graph, which indicates the thickness of this layer of film minus the thickness of the layer of copper on which the layer of film is at least partly overlaid. This copper layer may be the layer of the first stack that is overlaid on the core 405, with the relevant layer of film being the first layer of film overlaid on the bottommost copper layer of the stack. The relevant layer of film may be referred to as L6_ABF to indicate that it is sixth layer of film from the top of the substrate. The layer of copper on which the film is overlaid may be referred to as L7_Cu to indicate that it is the seventh layer of copper from the top of the substrate.

FIG. 8 shows a part 820 of the substrate that visually represents the metric shown along the bottom axis of the graph 800. The part 820 shows the core 405 on top of which is a layer 805 of copper and a layer 815 of film. Part of the layer 815 is overlaid directly on the top surface of the core 405, whilst another part of the layer 815 is overlaid on top of the copper layer 805. When the film layer 815 is added as part of the manufacture of the substrate, the film layer 815 is heated and deforms into the gaps in the copper 805. This leaves the part of the film 815 that is overlaid on the copper thinner than the film layer 815 as supplied and thinner than the part that is overlaid on the core 405. The thicker part of the film 815 overlaying the core 405 is indicated by arrow 830, whilst the thinner part of the film 815 is indicated by arrow 810, which corresponds to the metric shown on the bottom axis of the graph 800. It is this metric that is most closely related to the warpage that is observed for the substrate. This metric is referred to herein as the film over copper thickness 810. This thickness 810 represents the thickness of the part of the film 815 that is between and adjacent to two copper layers 805, 825 in the finished substrate.

The graph 800 shows the warpage for different samples of the substrate at 35 C°. As may be seen at a certain value for the thickness 810, the warpage behaviour changes from being more likely to be negative to being more likely to be positive. This point that marks the change in warpage is referred to here as the "flip point". The flip point occurs when the film over copper thickness 810 is the same as the film over copper thickness of the corresponding layer in the other stack. For the sample substrate data in graph 800, this value for the thickness 810 is equal to 14 µm.

When the distance 810 in a sample increases above the flip point (which in this example 14 μm), the sample is more likely to exhibit positive warpage. This part of the graph 800 is indicated by the region 'smile' (which is so named to indicate the visual impression that may be created by a substrate exhibiting positive warpage). Below the flip point (which in this example is 14 μm), the sample is more likely to exhibit negative warpage. This part of the graph 800 is indicated by the region 'cry' (which is so named to indicate the visual impression that may be created by a substrate exhibiting negative warpage).

As discussed above with respect to FIG. 5, the warpage behaviour when the film layers on either side have the same thickness is highly unpredictable and may take positive or negative values depending on the level of copper balance in the substrate. This is also illustrated in FIG. 8, which shows how when the thickness 810 for the film 815 in the top stack is approximately equal to the film over copper thickness for a corresponding film in the bottom stack (i.e. both are approximately equal to 14 μm), there is a wide variation in the warpage for different substrate samples. Some samples have positive warpage whilst others exhibit negative warpage. Whether a sample exhibits negative or positive warpage will depend upon factors other than the film thickness, such as the precise copper balance associated with the substrate.

As shown in FIG. 8, as the difference between the film over copper thicknesses increases, the warpage becomes either reliably negative or reliably positive. If the thickness 810 of the film in the top stack is greater than the film over copper thickness of the corresponding film in the bottom stack, the warpage behaviour is more likely to be positive. If the thickness 810 of the film in the top stack is less than the film over copper thickness of the corresponding film in the bottom stack, the warpage is more likely to be negative.

In embodiments, substrates may be provided with different values for the difference in film thickness between corresponding films in the two stacks. In some embodiments, this difference may be at least 1 μm. In other embodiments, this difference may be 1.5 μm. As shown in FIG. 8, at a difference in copper over film thickness of more than 1.5 μm, the warpage behaviour is in line with the trend for all of the samples shown.

As may be understood from FIG. 8, the warpage for the substrate does not increase in magnitude with increasing difference in thickness between corresponding film layers, but is more reliably either negative or positive. Therefore, setting the difference in film thickness to a higher value has the benefit that positive or negative warpage is more reliably achieved.

Figure 9:
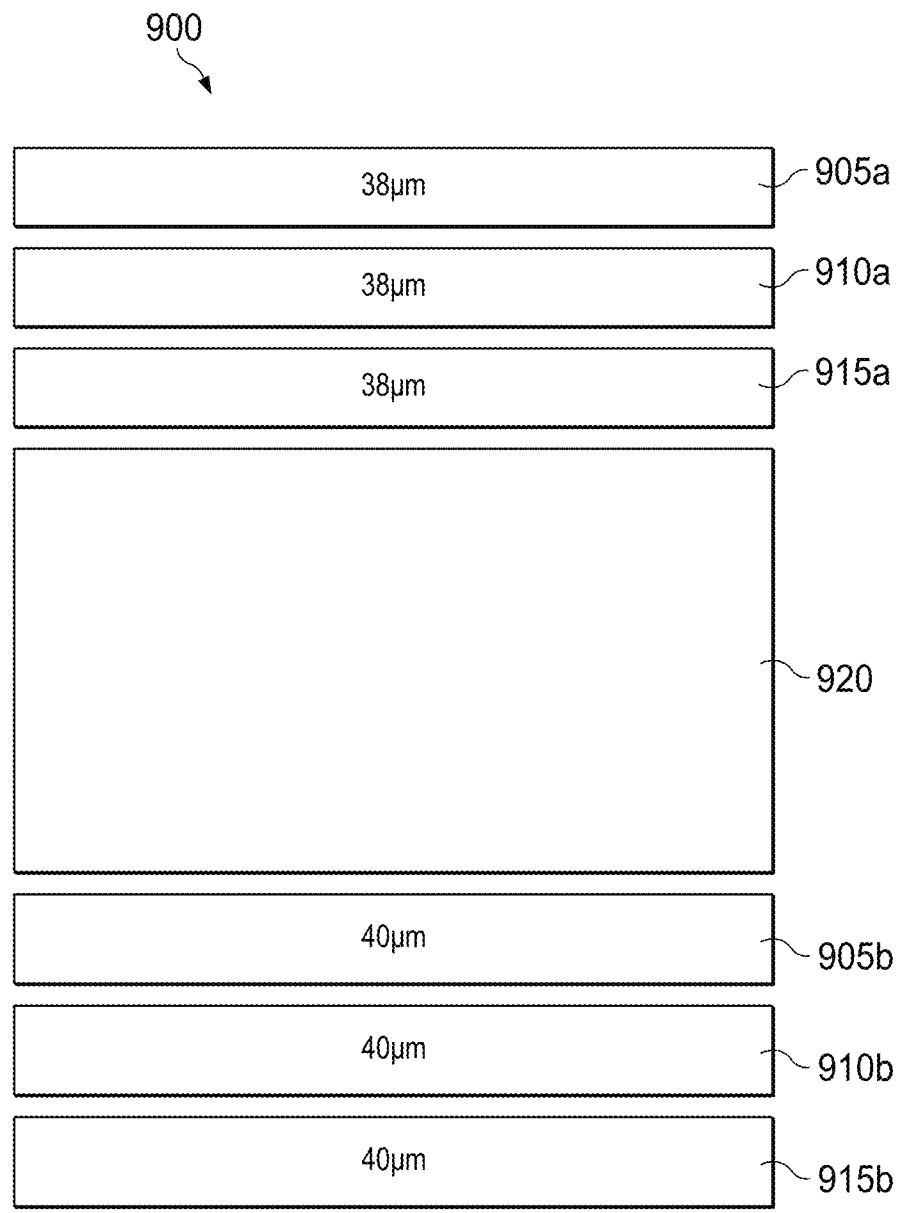
FIG. 9 illustrates part of a substrate in which multiple corresponding pairs of layers of electrically insulating film have different thicknesses to one another.

In some embodiments, a greater effect on the warpage may be achieved by introducing differences in thickness between more than one of the corresponding layers in the opposing stacks. In this way, not only is the warpage made either reliably negative or positive, but is made greater in magnitude. Reference is made to FIG. 9, which illustrates a part 900 of a substrate according to embodiments of the application. FIG. 9 shows how a plurality of different film layers on either side of the part 900 of the substrate may differ in thickness. Three layers 905*a*, 910*a*, 915*a* are shown as part of the first stack (e.g on top of the core 920). The layers 905*b*, 910*b*, 915*b* are shown as part of the second stack (e.g. on the bottom of the core 920). It would be appreciated that in embodiments, the first and the second stack are likely to contain more than three layers each, even if FIG. 9 only shows three layers.

The layer 905*a* corresponds to layer 905*b*, the layer 910*a* corresponds to layer 910*b*, and the layer 915*a* corresponds to layer 915*b*. Each of the 905*b*, 910*b*, 915*b* layers of the bottom stack is greater in thickness than its corresponding layer 905*a*, 910*a*, 915*a* of the top stack. The difference in thickness of the films when added to the part 900 of substrate in this example is 2 μm. Introducing differences in thickness between multiple corresponding layers of film in this way, is observed to increase the magnitude of the warpage to levels greater than shown in FIGS. 6 and 8.

In the examples described above with respect to FIGS. 6 to 9, the electrically insulating film has a greater CTE than copper. However, in other example embodiments of the invention, copper may have a greater CTE than the electrically insulating film. In this case, the warpage behaviour is reversed from that discussed above with respect to FIGS. 6 to 9. In order to achieve negative warpage, at least one layer of the electrically insulating film of the second stack is provided with a thickness that is less than the at least one of the layers of the electrically insulating film of the first stack. In this case, the arrangement of part 700 shown in FIG. 7 leads to negative warpage. In order to achieve positive warpage, at least one layer of the electrically insulating film of the second stack is provided with a thickness that is greater than the at least one of the layers of the electrically insulating film of the first stack. The arrangement of part 600 shown in FIG. 6 or the arrangement of part 900 in FIG. 9, therefore, leads to positive warpage.

Figure 10:
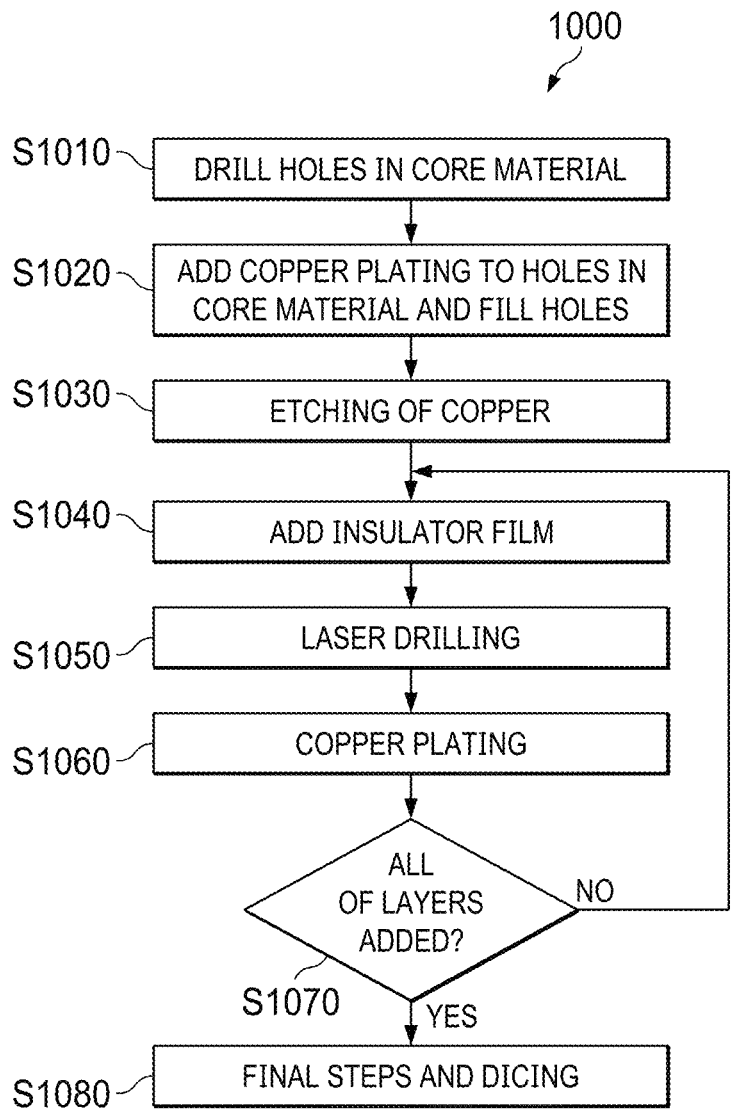
FIG. 10 illustrates a method of manufacturing a substrate according to embodiments of the application.

Reference is made to FIG. 10, which illustrates an example method 1000 for manufacturing a substrate according to embodiments of the application. It would be appreciated that not all of the steps of the method 1000 may be essential and in some embodiments one or more of the steps may be omitted. It would also be appreciated that the manufacturing process may include further steps not shown in FIG. 10, such as various cleaning or laminating steps, but which would be known to the skilled person. It would also be appreciated that although the manufacturing process describes building the stacks of layers on a core, in some embodiments, a substrate according to embodiments may be manufactured by developing opposing stacks using similar steps without the presence of a core between the opposing stacks.

At S1010, holes are drilled through the core material for the substrate. These holes are formed from one side of the core to the other and are used to form the vias for providing electrical connectivity between the two stacks. In FIG. 4, these vias are shown as vias 415.

At S1020, copper plating is added to the holes formed through the core. The copper plating provides the connections for the vias. After adding the copper plating, the holes are filed with resin. The copper plating therefore forms a connection along the edge of each via, which is otherwise filled with resin.

At S1020, the copper plating that is added into the holes is also added to the top and bottom surfaces of the core material to form the first layer of copper for each stack.

At S1030, the copper plating is etched so that the only copper remaining on the top and bottom surfaces of the core is the copper required for forming connections through the vias and for forming connections to the layer of copper to be added above. The nature of the etching depends upon the precise requirements for connections to the vias from the layers of copper that will be attached above this layer of copper.

At S1040, a layer of electrically insulating film is added on both sides of the partially formed substrate. For this first layer of substrate (which is the closest to the core of any of the layers of substrate to be subsequently added), part of the layer will be overlaid on the surface of the core and part will be overlaid on the copper layer added at S1020 and etched at S1030. The first layer on one side is part of the first stack and the first layer on the other side is part of the second stack. In embodiments, the first layers have different thicknesses, both when they are added to the stacks, and after they have been heated and deformed.

For example, if the method 1000 is applied to form the substrate part 600 shown in FIG. 6, the film that is added to form the first layer of film of the second stack (which is arranged on the bottom side of the substrate for attachment to the PCB) will have a thickness of 40 μm. The film that is added to form the first layer of film of the first stack (which is arranged on the bottom side of the substrate for attachment to the die) will have a thickness of 35 μm. In other embodiments, different thicknesses may be used for the films. In some embodiments, the minimum difference in thickness between the pairs of corresponding layers for which a thickness difference is applied may be 1 μm (when those films are added to the stacks).

When both of the layers of film have been added to each side of the partially constructed substrate, the partially constructed substrate is heated, and the film layers deform into the gaps between the layers of copper formed on the core surface. The result of this process is that both of the films become thinner at least at the regions of those films overlaying the copper. However, even after the films have been made thinner by the heating process, the two film layers will still have different thicknesses. For example, after heating, the part of the first layer of film of the second stack overlaid on the copper may have a thickness of 14 μm, whereas the part of the first layer of film of the first stack overlaid on the copper may have a thickness of 11 μm.

At S1050, a laser drilling process is performed in order to drill holes in the layers of electrically insulating film. These holes are drilled in the film at points at which it is required to make connections to the copper layer underneath. The holes are used to form vias, e.g. vias 430 in FIG. 4, when the next layer of copper is added at S1060.

At S1060, a further layer of copper is added on both sides of the partially constructed substrate. The further layer of copper is overlaid partly on top of the film layer added at S1040. Since the process at S1050 was performed to create holes in the film layer, another part of the copper added at S1060 will be laid on top of the copper below the film layer added at S1040. This allows for connectivity in each stack between the second layer of copper (added at S1060) and the copper of the first layer (added at S1030).

The process at S1060 to add copper to the surfaces of the partially constructed substrate may be performed by first adding a resist to parts of the surfaces of the partially constructed substrate. The copper may then be added to the remaining parts of the surface. Alternatively, copper may be added to the entirety of both surfaces of the partially constructed substrate and then an etching process performed to remove the copper at certain points. The result of either process is that the copper is provided at chosen points suitable for providing connections to the layer of copper below and suitable for providing connections to the layer above.

At S1070, if all of the layers of copper and electrically insulating film have been added, the process proceeds to S1080. If not, the process proceeds to S1040 at which a further layer of electrically insulating film is added. In some embodiments, the further pairs of corresponding films layers added to both stacks may, unlike the first pair of film layers, each comprise films of the same thickness. In other embodiments, at least one of the further pairs of film layers may be added with different thicknesses between these further corresponding films layers being used. Furthermore, although it has been described that the first film layers (i.e. the pair of corresponding film layers furthest from the substrate edge) have different thicknesses to one another, in other embodiments, these first film layers may instead have the same thickness, with thickness differences instead being used for one or more other pairs of corresponding films layers in the substrate.

The steps S1040-S1060 are repeated as many times as necessary to build up the layers of the stacks of the substrate.

At S1080, the substrate may be subject to lamination, development and pre-soldering steps. Once complete, the substrate is diced into small parts of substrate, each of which is suitable for mounting a single die to a PCB.

The described example method 1000 uses a build-up technique in which each layer of electrically insulating layer and copper is added separately. However, in other embodiments the method of manufacture may apply a pre-preg in which a layer of electrically insulating film can be provided with a layer of copper attached, with the pre-preg layers being deposited one on top of the other to produce each of the two stacks.

It will be appreciated that the above embodiments have been described by way of example only.

The invention claimed is:

1. A substrate for mounting at least one semiconductor die onto a printed circuit board, the substrate comprising:
   on a first side of the substrate suitable for being arranged towards the at least one semiconductor die, a first stack comprising a plurality of copper layers interleaved with layers of build-up film; and
   on a second side of the substrate suitable for being arranged towards the printed circuit board, a second stack comprising a plurality of copper layers interleaved with layers of the build-up film,
   wherein the build-up film has a higher co-efficient of thermal expansion than copper, and
   wherein each of one or more of the layers of the build-up film of the second stack has a different thickness to a corresponding one of the layers of the build-up film of the first stack; and
   wherein each of one or more of the layers of build-up film of the second stack has a thickness that is greater than its corresponding one of the layers of the build-up film of the first stack, such that in response to heat the substrate is configured to induce negative substrate warpage wherein the substrate curves away from the at least one semiconductor die at the edges of the at least one semiconductor die; or
   wherein each of one or more of the layers of build-up film of the second stack has a thickness that is less than its corresponding one of the layers of the build-up film of the first stack, such that in response to heat the substrate is configured to induce positive substrate warpage wherein the substrate curves towards the at least one semiconductor die at the edges of the at least one semiconductor die.

2. The substrate of claim 1, wherein each of the one or more of the layers of the build-up film of the second stack differs in thickness from its corresponding one of the layers of the build-up film of the first stack by more than one micrometre.

3. The substrate of claim 1, wherein a part of each of the one or more of the layers of the build-up film of the first stack has a first thickness, wherein the part of each of the one or more of the layers of the build-up film of the first stack is between and adjacent to two of the copper layers of the first stack,
- wherein a part of each of the corresponding layers of the build-up film of the second stack has a second thickness, wherein the part of each of the corresponding layers of the build-up film of the second stack is between and adjacent to two of the copper layers of the second stack,
- wherein the first thickness is different to the second thickness.

4. The substrate of claim 3, wherein the first thickness differs from the second thickness by more than one micrometre.

5. The substrate of claim 1, wherein the one or more of the layers of the build-up film of the second stack comprises one of the layers of build-up film of the second stack that is configured to be arranged furthest from the printed circuit board, wherein the corresponding ones of the layers of the build-up film of the first stack comprises one of the layers of build-up film of the first stack that is configured to be arranged furthest from the at least one semiconductor die.

6. The substrate of claim 1, wherein the one or more of the layers of the build-up film of the second stack comprises only a single layer of build-up film, wherein the corresponding one or more of the layers of the build-up film of the first stack comprises only a single layer of build-up film.

7. The substrate of claim 1, wherein the one or more of the layers of the build-up film of the second stack comprises a plurality of layers of the build-up film, wherein the corresponding one or more of the layers of the build-up film of the first stack comprises a plurality of layers of the build-up film.

8. The substrate of claim 1, wherein a young's modulus of the build-up film is lower than a young's modulus of copper.

9. The substrate of claim 1, wherein the substrate further comprises a core, wherein the first stack is arranged on a first side of the core, wherein the second stack is arranged on a second side of the core.

10. A device comprising:
- a substrate, wherein a first side of the substrate has a first stack comprising a plurality of copper layers interleaved with layers of build-up film, and wherein a second side of the substrate has a second stack comprising a plurality of copper layers interleaved with layers of the build-up film, wherein the build-up film has a different co-efficient of thermal expansion to copper, and wherein each of one or more of the layers of the build-up film of the second stack has a different thickness to a corresponding one of the layers of the build-up film of the first stack;
- a semiconductor die mounted on the substrate;
- a printed circuit board; and
- a plurality of solder balls forming connections between an outer copper layer of the second stack and connection pads of either the printed circuit board or a further substrate for mounting on the printed circuit board,
- wherein each of one or more of the layers of build-up film of the second stack has a thickness that is greater than its corresponding one of the layers of the build-up film of the first stack, such that in response to heat the substrate is configured to induce negative substrate warpage wherein the substrate curves away from the semiconductor die at the edges of the semiconductor die; or
- wherein each of one or more of the layers of build-up film of the second stack has a thickness that is less than its corresponding one of the layers of the build-up film of the first stack, such that in response to heat the substrate is configured to induce positive substrate warpage wherein the substrate curves towards the semiconductor die at the edges of the semiconductor die.

11. The device of claim 10, comprising a further plurality of solder bumps forming connections between an outer copper layer of the first stack and connection pads of the semiconductor die.

12. The device of claim 10, wherein the device comprises a flip chip package.

13. The device of claim 10, wherein the first side is arranged toward the semiconductor die and second side is arranged toward the printed circuit board.

* * * * *